(12) United States Patent
Schaefer et al.

(10) Patent No.: US 6,669,987 B1
(45) Date of Patent: Dec. 30, 2003

(54) METHOD FOR VACUUM TREATMENT OF WORKPIECES AND VACUUM TREATMENT FACILITY

(75) Inventors: Franz Josef Schaefer, Rankweil (AT); Helfried Weinzerl, Feldkirch (AT)

(73) Assignee: Unaxis Balzers Aktiengesellschaft, Balzers (LI)

( * ) Notice: Subject to any disclaimer, the term of this patent is extended or adjusted under 35 U.S.C. 154(b) by 0 days.

(21) Appl. No.: 09/958,404

(22) PCT Filed: Mar. 29, 2000

(86) PCT No.: PCT/CH00/00181
§ 371 (c)(1),
(2), (4) Date: Jan. 22, 2002

(87) PCT Pub. No.: WO00/63460
PCT Pub. Date: Oct. 26, 2000

(30) Foreign Application Priority Data

Apr. 16, 1999 (CH) ........................................ 1999 701/99

(51) Int. Cl.$^7$ .......................... C23C 14/56; C23C 16/54

(52) U.S. Cl. .................. 427/248.1; 204/192.1; 204/298.1; 204/298.07; 204/298.25; 204/298.33; 216/24; 216/58; 156/345.29; 156/345.31; 118/718; 118/719

(58) Field of Search ...................... 427/248.1; 204/192.1, 204/298.1, 298.07, 298.25, 298.33; 216/24, 58; 156/345.29, 345.31; 118/715, 719

(56) References Cited

U.S. PATENT DOCUMENTS 5,641,960 A * 6/1997 Okubo et al. ............... 250/310
6,074,486 A * 6/2000 Yang et al. .................. 118/719

* cited by examiner

*Primary Examiner*—Timothy Meeks
(74) *Attorney, Agent, or Firm*—Notaro & Michalos P.C.

(57) ABSTRACT

A lock chamber (1) is isolated from the environment (U) by a lock-valve (3) and from a vacuum chamber configuration (7) by a lock valve (5). A turbo vacuum pump (13) acts upon the vacuum chamber configuration (7). An additional pump (9/15) is switchably (17) connected downstream from the pump, which switchably operates either as a prevacuum pump for the turbo vacuum pump (13) or as lock chamber pump.

17 Claims, 2 Drawing Sheets

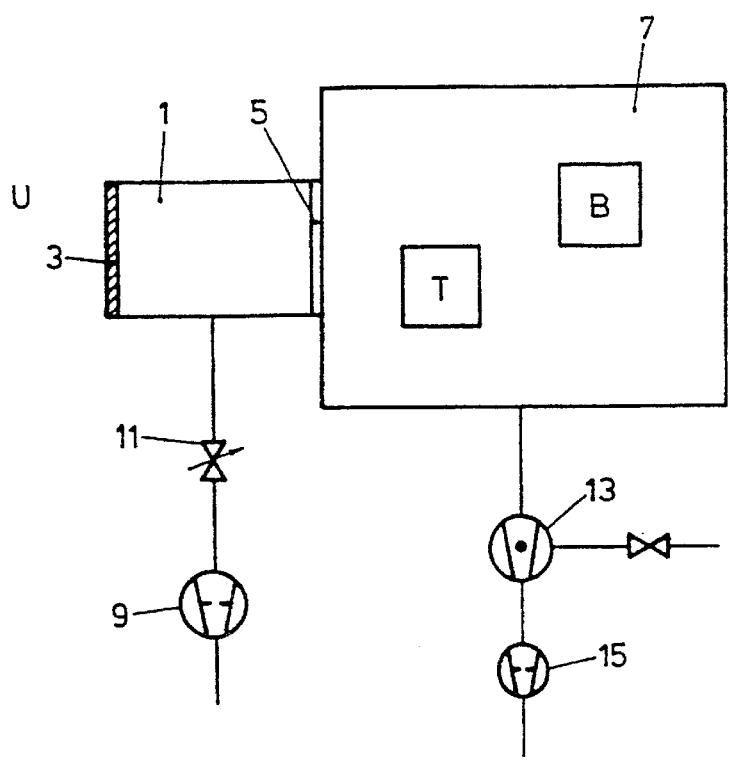
(PRIOR ART) FIG.1
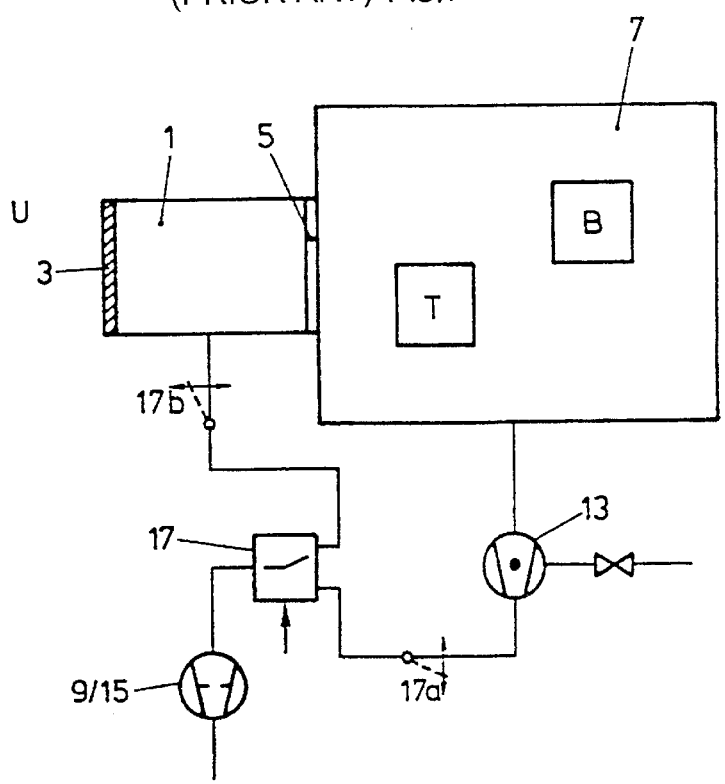
FIG.2

METHOD FOR VACUUM TREATMENT OF WORKPIECES AND VACUUM TREATMENT FACILITY

FIELD AND BACKGROUND OF THE INVENTION

The present invention relates to a method for the vacuum treatment of workpieces, in which a workpiece is introduced into an interlock chamber open to the ambient atmosphere, the interlock chamber is pumped out after it had been closed off from said ambient atmosphere, the interlock chamber is opened into an at least partially pumped-off vacuum chamber configuration, the workpiece subsequently is transported from the interlock chamber into the configuration and treated in the configuration, the workpiece subsequently is transported back from the configuration into the interlock chamber, the interlock chamber is closed against the configuration, is subsequently flooded and, lastly, the treated workpiece is carried from the flooded interlock chamber into the ambient atmosphere, wherein at least a portion of the configuration is pumped out by means of a turbo vacuum pump with a forevacuum pump operationally connected therewith at the high-pressure side and the interlock chamber is pumped out by means of an interlock pump.

The present invention relates further to a vacuum treatment installation comprising an interlock chamber, an interlock pump connected therewith, further communicating with the interlock chamber a vacuum chamber configuration operationally connected with at least one turbo vacuum pump, with which latter is associated at the high-pressure side a forevacuum pump.

In FIG. 1 is depicted in the form of a function block diagram one such prior known configuration, in which said prior known workpiece treatment method is readily evident to a person skilled in the art.

According to FIG. 1, an interlock chamber 1 with lock valve 3 against ambient atmosphere U is provided with a lock valve 5 against a vacuum chamber configuration 7. The vacuum chamber configuration 7 can therein comprise as a minimum configuration a single treatment chamber B or one or several transport chamber(s) operationally connected with the latter, again, one or several treatment chamber(s) B as well as, if appropriate further interlock chambers depending on how complex the treatment to be carried out on the workpieces is and how many steps it comprises. As is readily familiar to a person skilled in the art, the workpieces are introduced into the interlock chamber 1 with the lock valve 5 closed and lock valve 3 is opened, whereupon the lock valve 3 is closed and the interlock chamber 1 is evacuated by means of an interlock pump 9, such as for example a single- or multistage rotary vane pump and via a valve 11.

In principle, on the vacuum chamber configuration 7 at least one turbo vacuum pump 3 is provided, which pumps out at least the one treatment chamber, if appropriate jointly in combination with a transport chamber associated with this treatment chamber. If several treatment chambers are provided which are to be pumped independently of one another, it is entirely possible to provide several turbo vacuum pumps 13.

SUMMARY OF THE INVENTION

The at least one turbo vacuum pump 13, operationally connected with the vacuum chamber configuration 7, is succeeded at the high-pressure side by a forevacuum pump 15, in order to generate the required forepressure at the turbo vacuum pump 13.

It is the task of the present invention to further develop the method of the above described type such that it becomes cost-effective and that it becomes less susceptible to fault, further to simplify the installation of said type accordingly, and to realize it such that it requires less maintenance and has greater compactness. This is achieved with the method of said type thereby that as the forevacuum pump the interlock pump is operationally connected with the turbo vacuum pump.

To solve said task the vacuum treatment installation of the above described type is distinguished thereby that the forevacuum pump, associated with the turbo vacuum pump, is the interlock pump. The method according to the invention as well as also the configuration according to the invention are in particular well suitable for the treatment, in particular coating, of disk-shaped workpieces, in particular of storage disks, therein especially of optical data storage disks.

BRIEF DESCRIPTION OF THE DRAWINGS

The invention will subsequently be explained in conjunction with Figures. Therein depict:

FIG. 1 is a function block diagram of a prior art method,

FIG. 2 building on a representation according to FIG. 1, the fundamental further development according to the invention of the vacuum installation for realizing the production method according to the invention, FIG. 3 schematically the realization of a highly compact vacuum treatment installation according to the invention in a preferred embodiment.

Using the same reference symbols, in FIG. 2 the same vacuum treatment installation as depicted in FIG. 1, however, as will be described in the following, is further developed according to the invention.

DESCRIPTION OF THE PREFERRED EMBODIMENTS

Figure 3:
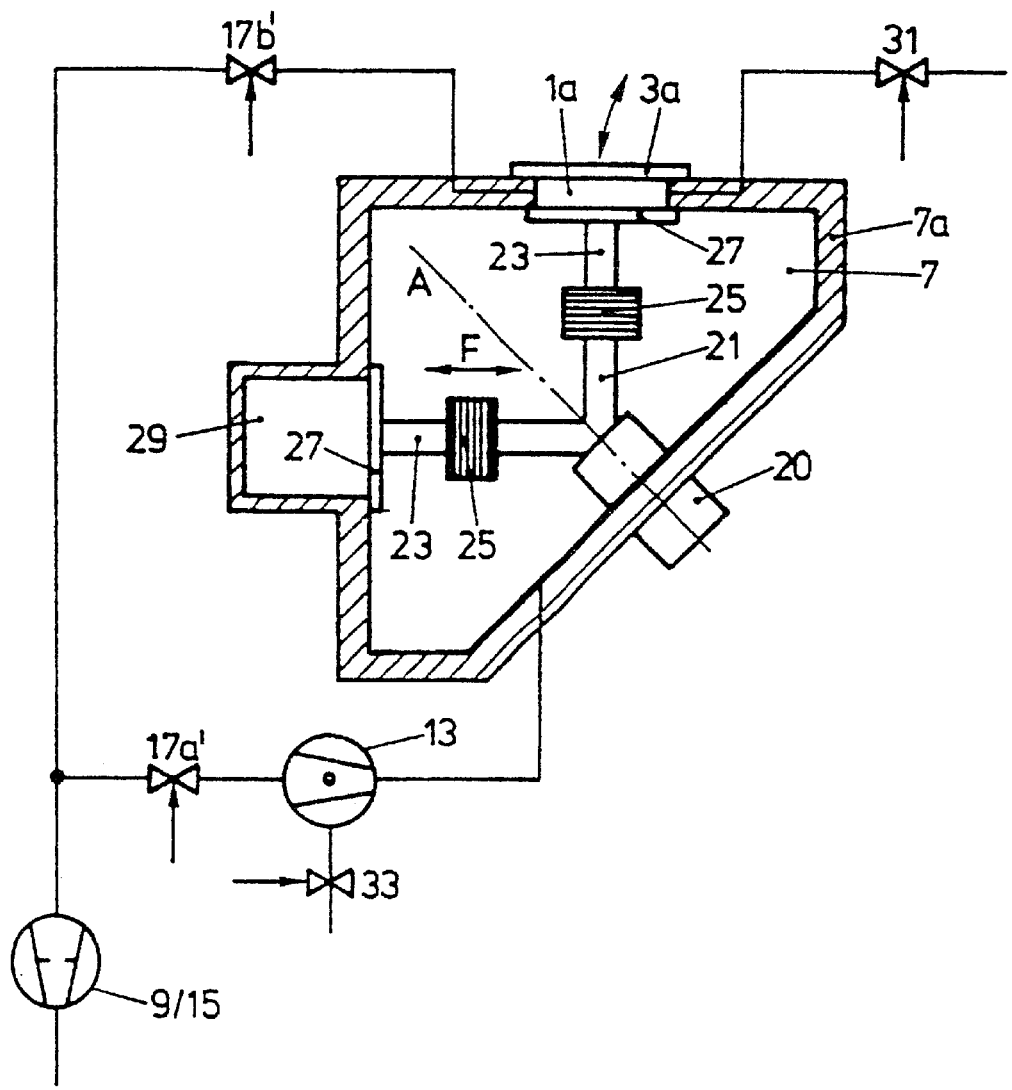

According to FIG. 2 the forevacuum pump succeeding the turbo vacuum pump 13 at the high-pressure side is omitted. In its place the interlock pump 9 is also employed as the forepump of the turbo vacuum pump 13. Therefore, in FIG. 2 the interlock/forevacuum pump used in combination is denoted by the combined reference symbol 9/15. In terms of signal technology thus the low-pressure side of the interlock-/forevacuum pump 9/15 is operationally connected via a controlled switch-over device 17 with the interlock chamber as well as also with the high-pressure side of the turbo vacuum pump 13. When loading a workpiece into the interlock chamber 1, for pumping out the interlock chamber 1 the low-pressure input of the interlock-/forevacuum pump 9/15 is isolated via the switch-over unit 17 from the high-pressure port of the turbo vacuum pump 13 and operationally connected with the interlock. After pumping out the interlock chamber 1 to transfer pressure to the vacuum chamber configuration 7, the low-pressure input of the interlock-/forevacuum pump 9/15 is operationally connected via said switch-over device 17 with the high-pressure side of the turbo vacuum pump 13.

It is entirely possible to realize the switch-over configuration 17, as indicated in dashed lines at 17a and 17b, by means of valves controllable independently of one another, or by means of a two-way valve such as the device 17 is also depicted.

The control of said operational connections can therein take place under pressure control, for example by measuring the pressure in the interlock chamber 1 and switching-over to forepump operation of the interlock-/forevacuum pump 9/15 upon reaching a predetermined pressure value or it can take place at a predetermined periodicity according to pre-ascertained cycles.

Preferably a turbo vacuum pump 13 is employed which at the high-pressure side can work against a maximally high pressure, preferably of at least 1 mbar, in particular preferred of at least 10 mbar. For this purpose are especially suitable turbo drag pumps or turbo pumps combined with Holweck stages at the pump output. As the interlock-/forevacuum pump, furthermore, a single- or multistage rotary vane pump is preferably used.

When applying said preferably used turbo vacuum pump 13 this even permits using a very "clean" membrane pump as the interlock-/forevacuum pump.

Furthermore, the interlock chamber 1 should be pumped out as rapidly as possible such that at the high-pressure side the turbo vacuum pump 13 does not need to operate too long in the operational connection, which in this case is closed, to the switch-over configuration 17 or to a closed valve 17a. Accordingly is dimensioned, on the one hand, the capacity of the provided interlock-/forevacuum pump 9/15, but in particular the volume of the interlock chamber 1. The latter should be selected to be of minimum size, the ratio of the interlock chamber volume to the volume pumped out by the provided turbo vacuum pump 13 should be selected to be maximally 1:40, preferably even maximally 1:100.

In FIG. 3 is depicted schematically a preferred, highly compact vacuum treatment installation according to the invention for the vacuum treatment according to the invention of workpieces, in particular circular disk-shaped workpieces, such as for example, and preferably, of data storage disks.

In a housing 7a of the vacuum chamber configuration 7 a transport device 21 is provided driven rotationally movable about an axis A by means of a drive 20, with transport arms 23 bent off at an angle with respect to the axis of rotation A. By means of associated linear drives, such as shown at 25, the transport arms 23 are encapsulated, extendable and retractable, as shown by F. At their ends they support workpiece carrier plates 27 for (not shown) workpiece disks. The vacuum chamber configuration 7 comprises a working station 28, for example flanged onto the housing 7a, a working station 29, such as for example a sputter station.

The volume of a provided interlock chamber 1a is minimized thereby that it is virtually integrated into the section thickness of the wall of the housing 7a. This minimization, previously already discussed in conjunction with FIG. 2, of the interlock chamber volume is possible in the extent depicted in FIG. 3, in particular in combination with the treatment, for example in particular of the coating, of disk-shaped workpieces, in particular of storage disks, therein especially of optical data storage disks.

With the depicted installation according to the invention in particular according to FIG. 3, cycle times, for example, of less than 2 seconds were attained in the CD production or the production of optical storage disks, concretely of 1.8 seconds at a lock passing time of 0.4 seconds.

Fundamentally it is preferably proposed that the sub-interval range of the cycle time "transportation and treatment" is at least 50% of the total cycle time, preferably at least 60%, or expressed with respect to the "lock passage time", at least 300%.

The outer lock valve is denoted by 3a, the inner one is formed by the workpiece carrier plate 27 on the particular transport arm 23. By rotation of the transport device 21 about axis A, the provided transport arms or the retracted carrier plates 27 are first placed into position onto interlock chamber 1a and working station 29. By extending the arms the corresponding stations 1a, 29 are sealed off, either by setting up a pressure stage, such as by means of labyrinth sealing, or vacuum-tight, for example form-fittingly. On the one hand, in this case at the interlock chamber 1a by opening the lock valve 3a a workpiece is input or output, while simultaneously at the working station 29, either closed or sealed according to the requirements, the workpiece working takes place.

A configuration of this type is fully described in EP A 0 518 109 corresponding to U.S. Pat. No. 5,245,736 by the applicant as well as in the present application.

As is evident, the switch-over device 17, described in conjunction with FIG. 2, is preferably realized by means of valves 17b' or 17a' inserted into the connection line. In the embodiment depicted, the turbo vacuum pump 13 pumps out the interior volume of the transport chamber as well as also the process chamber. A ratio of the volumes of interlock chamber 1a to the volume pumped out by the turbo vacuum pump 13 of 1:110 was realized.

In FIG. 3, 31 denotes a flooding valve for the interlock chamber 1a, 33 the flooding valve, already depicted in FIGS. 1 and 2, for the turbo vacuum pump 13.

What is claimed is:

1. A method for vacuum treatment of workpieces, comprising:

a) introducing a workpiece into an interlock chamber (1) that is open to an ambient atmosphere (U);

b) pumping out the interlock chamber (1) after the interlock chamber has been closed (3) against said ambient atmosphere;

c) opening the interlock chamber into a vacuum chamber configuration (7) which is at least partially pumped out;

d) transporting the workpiece from the interlock chamber (1) into the configuration (7);

e) treating the workpiece in the configuration (7);

f) transporting the workpiece back from the configuration (7) into the interlock chamber (1);

g) closing (5) the interlock chamber (1) against the configuration (7), and subsequently flooding the interlock chamber;

h) carrying the treated workpiece from the flooded interlock chamber (1) into the ambient atmosphere (U);

i) pumping out at least a portion of the configuration (7) by means of a turbo vacuum pump (13) with a forevacuum pump (15) operationally connected therewith at a high-pressure side of the turbo vacuum pump;

j) pumping out at least a portion of the interlock chamber (1) by means of an interlock pump (9); and k) operationally connecting the interlock pump (9) to the turbo vacuum pump (13) to act as the forevacuum pump (15) with a ratio of the interlock chamber volume to be pumped to a volume to be pumped by means of the turbo vacuum pump (13) being maximally 1:40.

2. A method as claimed in claim 1, wherein, as the interlock and forevacuum pump (9/15), a single or multistage rotary vane or membrane pump is employed.

3. A method as claimed in claim 1, wherein the turbo vacuum pump (13) at the high-pressure side works against a pressure of at least 1 mbar.

4. A method as claimed in claim 3, wherein the turbo vacuum pump (13) at the high-pressure side works against a pressure of at least 10 mbar and the turbo vacuum pump is a turbo drag or a turbo pump with Holweck stage.

5. A method as claimed in claim 1, wherein for pumping out the interlock chamber (1) at a low-pressure side, the forevacuum pump (9/15) is isolated (17, 17a) from its operational connection with the turbo vacuum pump (13), subsequently for pumping out the portion of the configuration (17, 17b), the forevacuum pump (9/15) is isolated from the interlock chamber (1) and is connected at the high-pressure side with the turbo vacuum pump (13).

6. A method as claimed in claim 1, wherein a low-pressure input of the interlock and the forevacuum pump (9/15) is sequentially operationally connected (17, 17a, 17b) to the interlock chamber (1), and to the high-pressure output of the turbo vacuum pump (13).

7. A method as claimed in claim 6, wherein a low-pressure input of the interlock and the forevacuum pump (9/15) is sequentially intermittently operationally connected to the interlock chamber (1) and to the high-pressure output of the turbo vacuum pump (13).

8. A method as claimed in claim 1, wherein the ratio of the volume of the interlock chamber (1) to be pumped out to that which is to be pumped out by means of the turbo vacuum pump (13) is selected to be maximally 1:100.

9. A method as claimed in claim 1 for coating a disk-shaped workpiece.

10. A method as claimed in claim 1 for coating of optical storage disks, wherein a cycle time from the introduction of the workpiece up to and including carrying away of the workpiece is maximally 2 seconds.

11. A method as claimed in claim 1, wherein a time range for steps c) to g) is at least 50% of the time range for steps a) to h).

12. A vacuum treatment installation comprising:
  an interlock chamber (1);
  an interlock pump (9) operationally connected to the interlock chamber;
  a vacuum chamber configuration (7) communicating with the interlock chamber (1)
  at least one turbo vacuum pump (13) operationally connected to the vacuum chamber configuration (7);
  a forevacuum pump (15) associated with a high-pressure side of the turbo vacuum pump (13);
  the forevacuum pump (15) being associated with the turbo vacuum pump (13) is the interlock pump (9/15) and a ratio of the interlock chamber volume to be pumped to the volume to be pumped by means of the turbo vacuum pump (13), is maximally 1:40.

13. An installation as claimed in claim 12, wherein the interlock and forevacuum pump (9/15) is a single or a multistage rotary vane pump or a membrane pump.

14. An installation as claimed in claim 12, wherein the turbo vacuum pump (13) is disposed such that at the high-pressure side it works against a pressure of at least 1 mbar.

15. An installation as claimed in claim 14, wherein the turbo vacuum pump (13) is disposed such that at the high-pressure side it works against a pressure of at least 10 mbar and it is a turbo drag or turbo pump with Holweck stage.

16. An installation as claimed in claim 12, wherein a low-pressure input of the interlock and forevacuum pump (9/15) is operationally connected via a switch-over configuration (17, 17a, 17b) to the interlock chamber (1) and to the high-pressure output of the turbo vacuum pump (13).

17. An installation as claimed in claim 12, wherein the ratio of the interlock chamber volume to be pumped and the volume to be pumped by means of the turbo vacuum pump (13) is maximally 1:100.

* * * * *